United States Patent [19]

Doucet et al.

[11] Patent Number: 4,627,088
[45] Date of Patent: Dec. 2, 1986

[54] INTENSE X-RAY SOURCE USING A PLASMA MICROCHANNEL

[75] Inventors: Henri T. Doucet, Les Molieres; Michel Gazaix, Antony; Henri Lamain, Clamart; Claude Rouillé, Magny-les-Hameaux; Jean-Pierre Furtlehner, Jouy-en-Josas, all of France

[73] Assignees: Centre National de la Recherche Scientifique; Commissariat a l'Energie Atomique, both of Paris, France

[21] Appl. No.: 643,458

[22] Filed: Aug. 23, 1984

[30] Foreign Application Priority Data

Sep. 2, 1983 [FR] France ................. 83 14086

[51] Int. Cl.[4] .............. H01J 35/00; H01J 35/22
[52] U.S. Cl. .................... 378/122; 376/144; 378/119
[58] Field of Search ............ 378/119, 34, 43, 122; 376/144

[56] References Cited

U.S. PATENT DOCUMENTS

| | | |
|---|---|---|
| 3,746,860 | 7/1973 | Shatas et al. ............ 378/119 |
| 3,946,236 | 3/1976 | Roberts et al. ........... 378/103 |
| 4,058,486 | 11/1977 | Mallozzi et al. . |
| 4,152,625 | 5/1979 | Conrad .............. 315/111.71 |
| 4,179,599 | 12/1979 | Conrad . |
| 4,504,964 | 3/1985 | Cartz et al. ............ 378/119 |
| 4,538,291 | 8/1985 | Iwamatsu .............. 378/119 |

OTHER PUBLICATIONS

Dinev, et al; X-Ray Emission from a Laser Irradiated Target in the Presence of High Electric Field, Optics Communications, Aug. 1979, vol. 30, #2.
Zory, Coherent X-Ray Generator, IBM Tech. Disclos. Bulletin, Jan. 1976, vol. 18, #8.
J. Bruneteau et E. Fabre, Photoionisation D'Un Gaz Par Le Rayonement Ultra Violet Extreme D'Un Plasma Cree Par Laser, Physics Letters, Jun. 5, 1972, vol. 39A, #5.

Primary Examiner—Bruce C. Anderson
Assistant Examiner—T. N. Grigsby
Attorney, Agent, or Firm—Birch, Stewart, Kolasch & Birch

[57] ABSTRACT

Intense soft X-ray source having an enclosure filled with gas and having two electrodes connected to a high voltage source, one of the electrodes having an opening. A device is provided for producing a photoionizing radiation directed through the opening. The radiation traversing the gas in the direction of the other electrode and during its passage producing a plasma microchannel, an electrical discharge supplied by the source then occurring in the microchannel, wherein the device for producing the photoionizing radiation is an auxiliary soft X-ray source.

5 Claims, 2 Drawing Figures

INTENSE X-RAY SOURCE USING A PLASMA MICROCHANNEL

BACKGROUND OF THE INVENTION

The present invention relates to an intense soft X-ray source using a plasma microchannel obtained by the photoionization of a gas.

The plasmas to which the invention relates are dense, hot plasmas. Their electron density exceeds approximately $10^{18}$ cm$^{-3}$ and their electron temperature is in the range between a few hundred electron volts to a few kiloelectron volts.

Such plasmas can constitute intense soft X-radiation sources which, compared with other X-ray sources have numerous advantages, such as:

their low cost,
their overall dimensions are sufficiently reduced to enable them to be positioned at the point of use of the X-radiation,
easy to use and maintain,
high energy efficiency.

These advantages make such sources suitable for microlithography, whilst also being usable in fast X-ray microscopy.

These sources include those involving an intense electrical discharge through a plasma microchannel, which is heated by the Joule effect and becomes the seat of an intense emission of soft X-rays.

However, despite their interest, these sources are confronted by the following difficulty. A dense, hot plasma has a resistivity which, in the absence of turbulence or instabilities, can be described by the Spitzer formula, which is only dependent on the temperature and is in the form:

$$10^{-3}/(kT)^{3/2}$$

in which k is the Boltzmann constant and T is the temperature.

The variation of the resistivity in $1/T^{3/2}$ makes it very difficult to heat a plasma by the Joule effect because, as the temperature rises, the resistivity falls and so does the Joule effect. However, this heating remains possible on using a plasma microchannel, i.e. a channel with a very small diameter. This procedure is presently used in controlled thermonuclear fusion.

In order to produce a very fine plasma channel, the use is presently made of ionization by the laser breakdown of a high pressure gas or by the photoionization of this gas under the influence of a small diameter laser beam. The thus obtained plasma line also has a diameter of a few hundred microns, but it would appear difficult to drop below this.

For example, devices of this type have been described in the paper entitled "Recent results on dense Z pinches" given by J. E. HAMMEL et al at the "Symposium on new trends in unconventional approaches to magnetic fusion", given at the Royal Institute of Technology, Stockholm, June 16 to 18, 1972.

An important difficulty encountered in research on controlled thermonuclear fusion is that of confining a hot, dense plasma for a sufficient time to satisfy the Lawson criterion. This difficulty no longer appears in the application to the formation of soft X-radiation when using pulsed sources, which can e.g. be employed in microlithography.

SUMMARY OF THE INVENTION

The present invention relates to an improvement to these sources consisting of replacing the conventional optical radiation used for the photoionization of the gas by soft X-radiation. The latter is much more effective than visible optical radiation, particularly for the ionization of high pressure gases. For example, in hydrogen, the absorption distance of soft X-photons is approximately a few millimeters at atmospheric pressure. Thus, they can be used by passing them through a diaphragm with a diameter of a few dozen microns, in order to ionize a plasma microchannel. The latter is then heated by the Joule effect, as in conventional sources.

The paradoxical nature of the invention will be apparent, in that it recommends the use of soft X-rays for supplying a source, whose objective is to obtain soft X-rays. Thus, this constitutes a break with the conventional concept recommending the use of different means, namely lasers.

It is necessary to stress the interest of the use of X-rays for producing a plasma microchannel. As the wavelength of the soft X-rays used is much less than that of optical radiation produced by lasers, the minimum dimensions which can be achieved, bearing in mind the limitations imposed by diffraction, are much smaller than in the visible or near ultraviolet. Thus, it is known that the dimensions of the minimum spot of a radiation are proportional to the wavelength. The plasma microchannel obtained with the invention will consequently have a much smaller diameter than in the prior art, which is very favourable to the process of heating by the Joule effect, as stated hereinbefore.

According to a preferred embodiment of the invention, the means for producing the photoionization soft X-radiation are constituted by a pulsed laser pulling on a heavy metal target. For example, it is possible to use a ruby laser pulling on a lead target.

The paradoxical nature of this arrangement is once again obvious. Whereas in the prior art, the radiation emitted by the laser was passed directly into the gas in order to bring about there a photoionization, according to the invention preference is given to pulling on an intermediate target and then using the radiation from the latter. Contrary to what could be imagined, this intermediate stage added to the process is not prejudicial to the overall operating efficiency and on the contrary due to the greater effectiveness of the X-radiation in the photoionization mechanism and the reduction in the plasma diameter, the opposite is the case. These two favourable effects compensate the energy loss due to the conversion on the target of the optical radiation into X-radiation. Moreover, the conversion into soft X-rays obtained by this process is very considerable because 10% of the energy of the laser radiation is converted into radiation between 80 and 130 Angströms.

The behaviour of a target exposed to the radiation of a laser has already been described in several works. The use of radiation reemitted by such a target in the photoionization of a gas has, for example, been described in the article by J. BRUNETEAU and E. FABRE entitled "Photoionization of a gas by extreme ultraviolet radiation of a plasma produced by a laser" and published in Physics Letters, Vol. 39A, No. 5, June 5, 1972, 00.411–412. However, in this case it is the extreme ultraviolet radiation (85 to 130 eV) emitted by the target which was used and which had to pass through a thin gold film used as a window and photoionize a gas over a large volume. The invention adapts this means for a novel application by directly introducing the X-radiation into the ionization chamber through a very small opening, in order to produce a very small diameter channel and by using differential pumping for preventing a significant loss of ionizing radiation.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
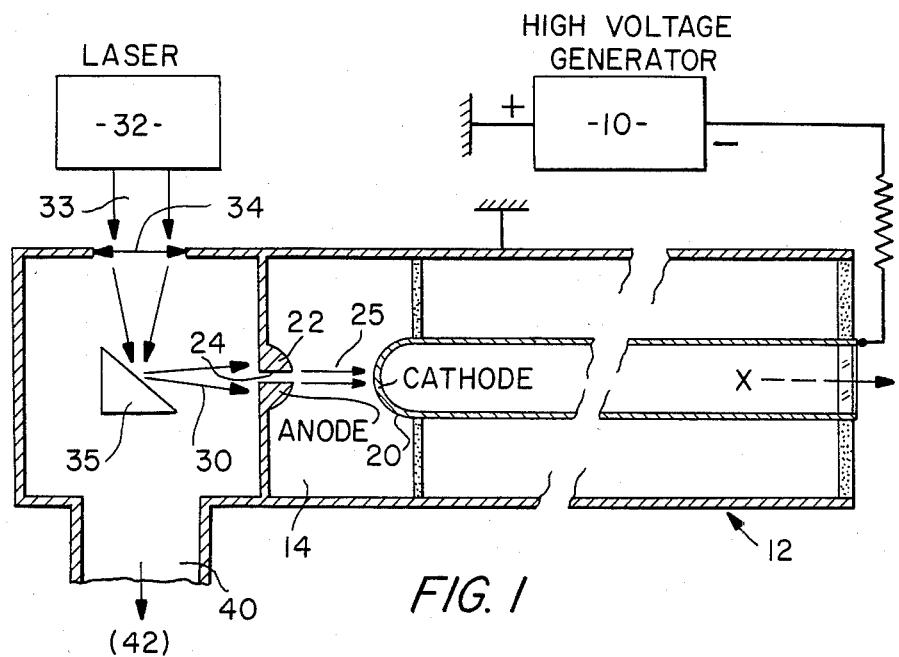
FIG. 1 a diagrammatic view of a source according to the invention.

As shown in FIG. 1, the source comprises in per se known manner a high voltage generator 10 connected to a transmission line 12, an enclosure 14 filled with gas and provided with two electrodes, a cathode 20 and an anode 22, the latter having a small diameter opening 24.

According to the invention, the photoionization radiation 30 passing through opening 24 and producing microchannel 25 is soft X-radiation. In the illustrated variant, which corresponds to the preferred embodiment of the invention, the means for producing this X-radiation comprise a laser 32, whereof the radiation 33 passes through a window 34, provided with a focusing lens and then strikes against a heavy material target 35. The front face of this target is oriented in such a way that the soft X-rays emitted can, in part, pass through the opening 24 made in anode 22 and acting as a diaphragm. The assembly is pumped through a tube 40 by means of a not shown pump 42.

Preferably, laser 32 is a ruby laser emitting energy pulses of approximately 1 Joule and which last approximately 10 nanoseconds. The target is preferably of lead. Enclosure 14 can contain hydrogen, e.g. under a pressure of 1 atmosphere.

Generator 10 can be a d.c. voltage generator. In this case, the main discharge through microchannel 25 is initiated by the appearance of said microchannel, so that the cell with electrodes 20-22 behaves like a true spark gap. However, generator 10 can also be a pulsed generator and in this case is synchronized with the laser, as in the prior art.

Figure 2:
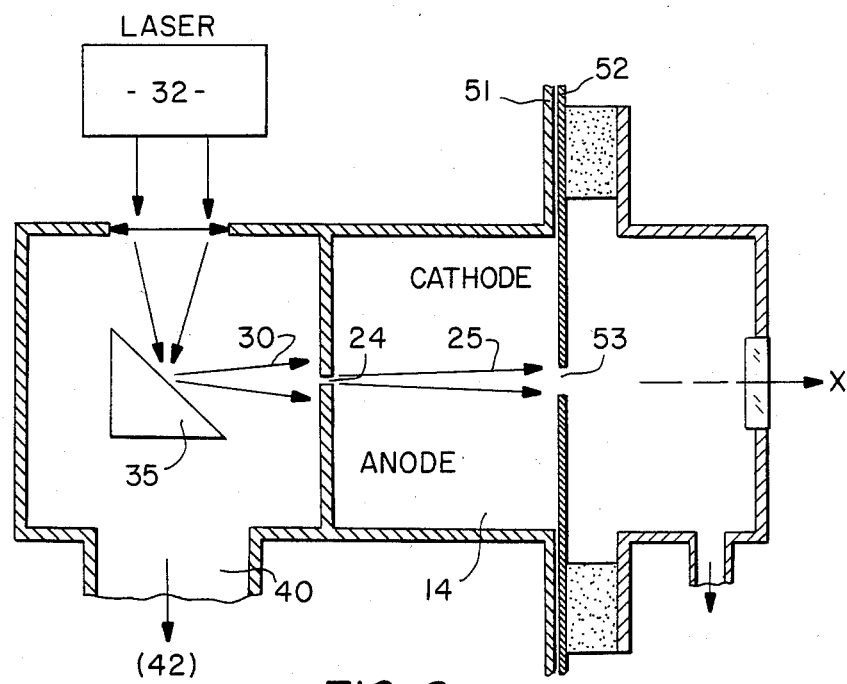
FIG. 2 a flat line variant.

The transmission line 12 can be a coaxial line (e.g. of impedance 0.5Ω), but can also be a flat line with two conductors giving the device the special configuration shown in FIG. 2.

The line is formed from two plates 51, 52, the first moving away from the second to form the gas-filled enclosure 14. This first plate has an opening 24 to permit the penetration of the soft X-ray beam 30. Thus, microchannel 25 extends from plate 51 to plate 52. The latter also has an opening 53 to permit the extraction of the intense soft X-radiation produced by the discharge in the microchannel.

Naturally, other arrangements can be conceived on the basis of various transmission lines, pulsed or unpulsed generators, lasers or means for producing the initial X-radiation. With this respect, it is possible to have a cascade arrangement of X-ray sources, the first functioning according to the principle of FIGS. 1 and 2, i.e. with a laser, but the second and following directly using the X-radiation produced by what precedes (in total or in part).

What is claimed is:

1. An intense soft X-ray source comprising:
   an enclosure filled with gas and having two electrodes connected to a high voltage source by a transmission line, one of the electrodes having an opening;
   means for producing a photoionizing radiation directed through said opening;
   said radiation traversing the gas in the direction of the other electrode and during its passage producing a plasma microchannel;
   an electrical discharge supplied by the source then occurring in the microchannel;
   wherein the means for producing the photoionizing radiation is an auxiliary soft X-ray source.

2. A source according to claim 1, wherein the auxiliary soft X-ray source comprises a laser producing optical radiation pulses, a solid metal target placed in the path of the radiation emitted by the laser, said target producing soft X-rays under the effect of this radiation, the target being oriented in such a way that part of the said soft X-rays pass through the opening made in the electrode.

3. A source according to claim 2, wherein the laser is a ruby laser and the target is made from lead.

4. A source according to claim 1, wherein the high voltage source is a d.c. voltage source.

5. A source according to claim 1, wherein the transmission line is a flat line with two conductors forming the enclosure.

* * * * *